United States Patent [19]
Kweon

[11] Patent Number: 5,811,318
[45] Date of Patent: Sep. 22, 1998

[54] METHOD FOR MANUFACTURING A LIQUID CRYSTAL DISPLAY

[75] Inventor: Young-chan Kweon, Seoul, Rep. of Korea

[73] Assignee: Samsung Electronics Co., Ltd., Suwon, Rep. of Korea

[21] Appl. No.: 770,796

[22] Filed: Dec. 20, 1996

[30] Foreign Application Priority Data

Dec. 28, 1995 [KR] Rep. of Korea ..................... 95-62170
May 29, 1996 [KR] Rep. of Korea ..................... 96-18516

[51] Int. Cl.$^6$ ..................................................... H01L 21/84
[52] U.S. Cl. .............................. 438/30; 438/158; 257/59; 349/152
[58] Field of Search ............................. 438/30, 158, 159, 438/160, 592, 182, 200; 257/59, 72; 349/46, 139, 152, 149

[56] References Cited

U.S. PATENT DOCUMENTS

| | | | |
|---|---|---|---|
| 5,075,244 | 12/1991 | Sakai et al. ................................ | 437/41 |
| 5,177,577 | 1/1993 | Taniguchi et al. ......................... | 257/59 |
| 5,187,604 | 2/1993 | Taniguchi et al. ......................... | 359/88 |
| 5,359,206 | 10/1994 | Yamamoto et al. ....................... | 257/59 |
| 5,555,112 | 9/1996 | Oritsuki et al. ............................ | 359/59 |
| 5,668,379 | 9/1997 | Ono et al. .................................. | 257/59 |

FOREIGN PATENT DOCUMENTS 5-152573  6/1993  Japan .
6-188419  7/1994  Japan .

Primary Examiner—Charles L. Bowers, Jr.
Assistant Examiner—Laura Schillinger
Attorney, Agent, or Firm—Jones & Volentine, L.L.P.

[57] ABSTRACT

A method for manufacturing a liquid crystal display which reduces the number of photolithography processes is provided. The method includes the steps of forming a gate electrode and a gate pad by depositing a first metal film and a second metal film on a substrate of a TFT area and a gate-pad connecting area, respectively, in the described order, by a first photolithography process, forming an insulating film on the entire surface of the substrate on which the gate electrode and the gate pad are formed, forming a semiconductor film pattern on the insulating film of the TFT area by a second photolithography process, forming a source electrode/drain electrode and pad electrode composed of a third metal film using a third photolithography process in the TFT portion and pad portion, respectively, forming a passivation film pattern which exposes a portion of the drain electrode, a portion of the gate pad, and a portion of the pad electrode by a fourth photolithography process, exposing the first metal film by etching the second metal film which constitutes the gate pad using the passivation film pattern as a mask, and forming a pixel electrode connected to the drain electrode of the TFT area for connecting the gate pad of the gate-pad connecting area to the pad electrode of the pad area using a fifth photolithography process. Therefore, it is possible to reduce the number of photolithography processes, to improve the manufacturing yield, and to suppress growth of a hillock of an Al film.

15 Claims, 8 Drawing Sheets

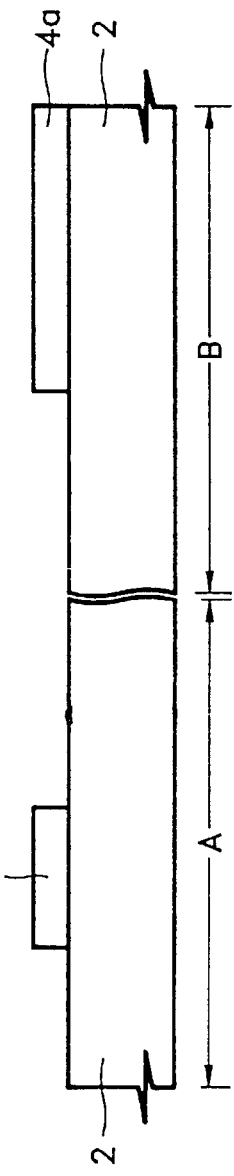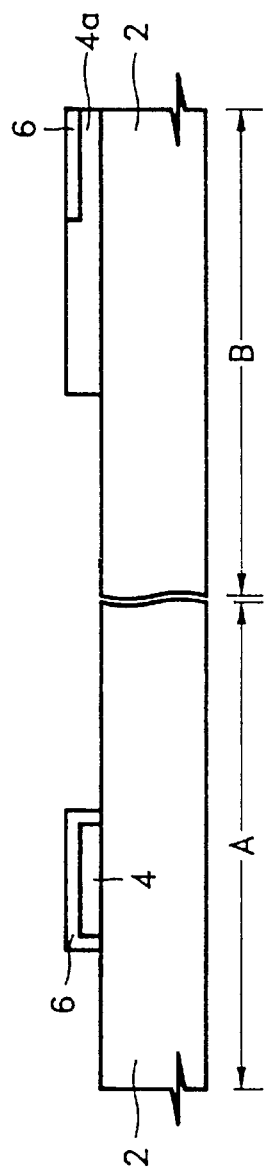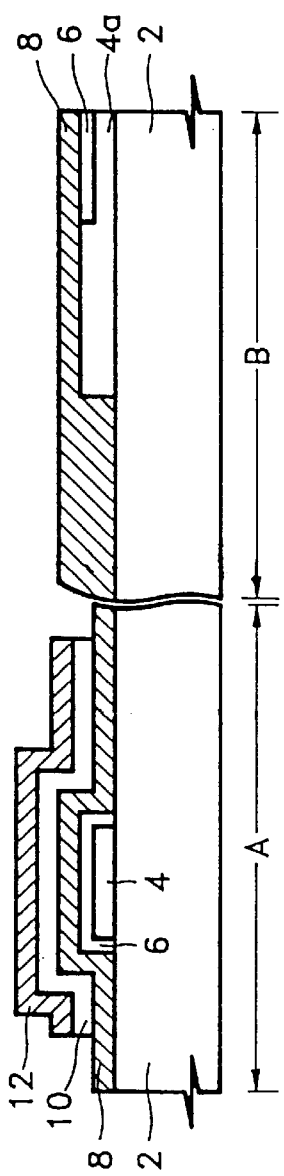

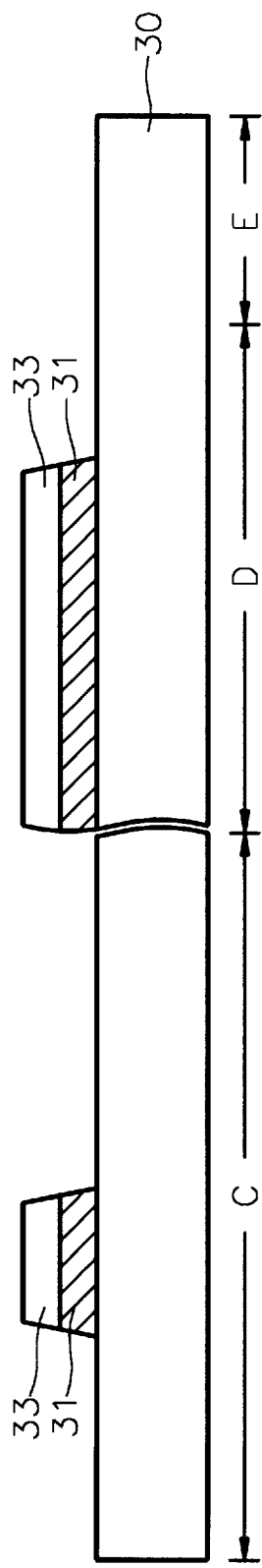
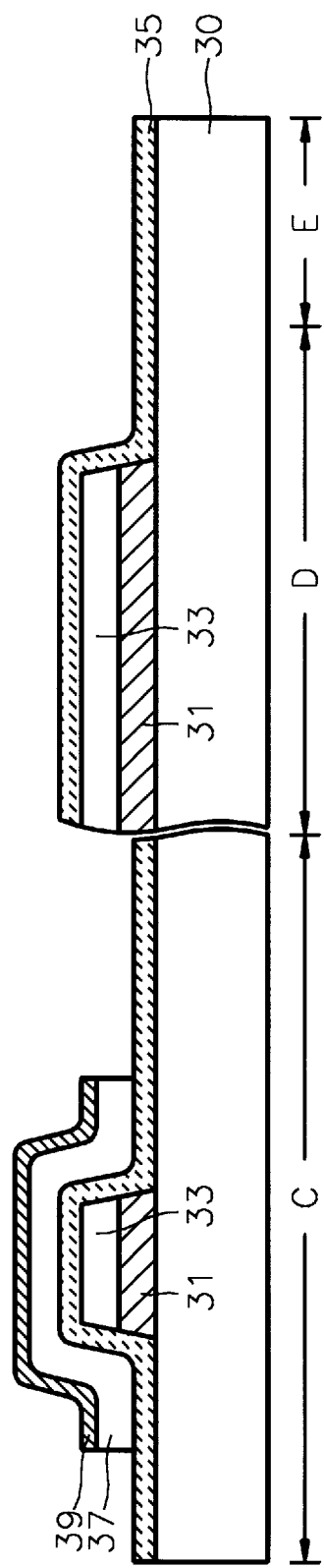

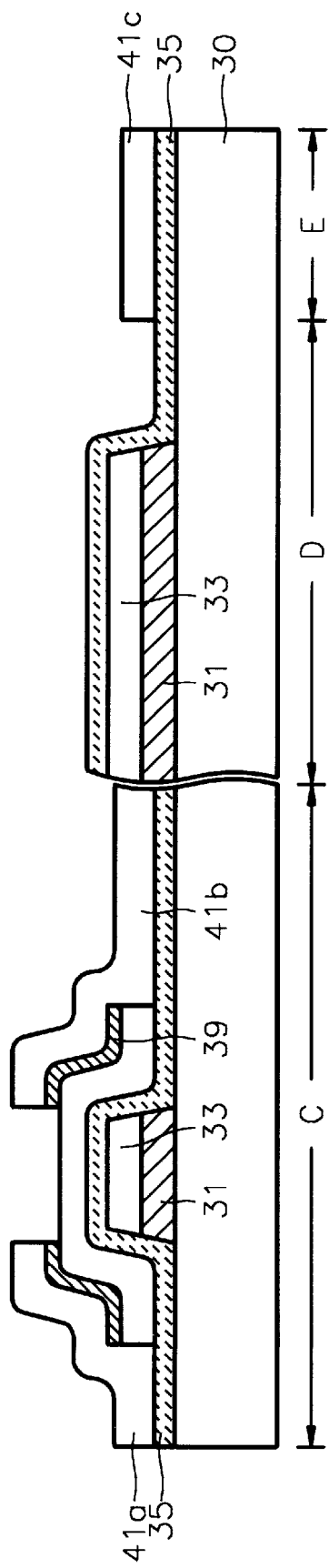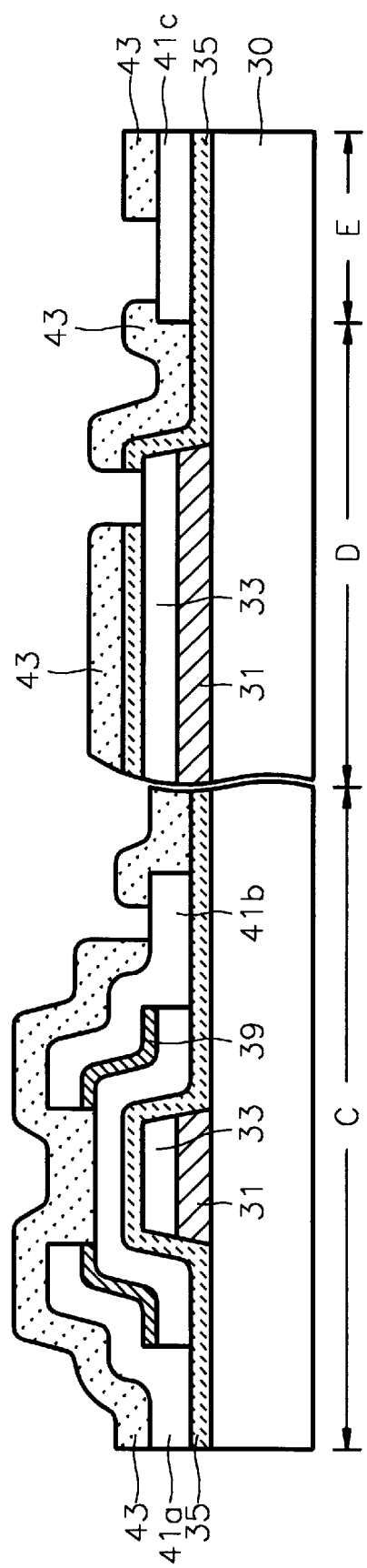

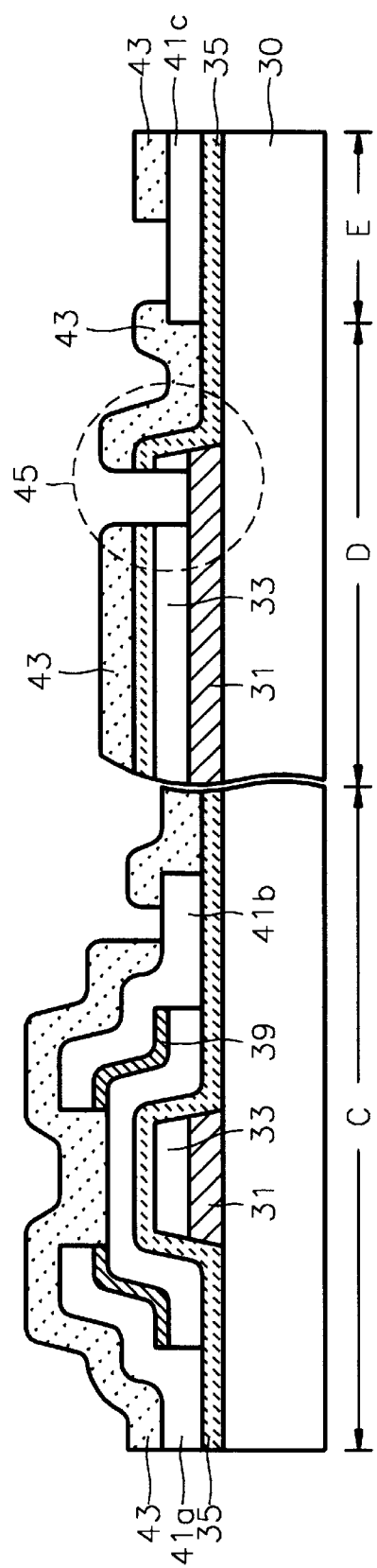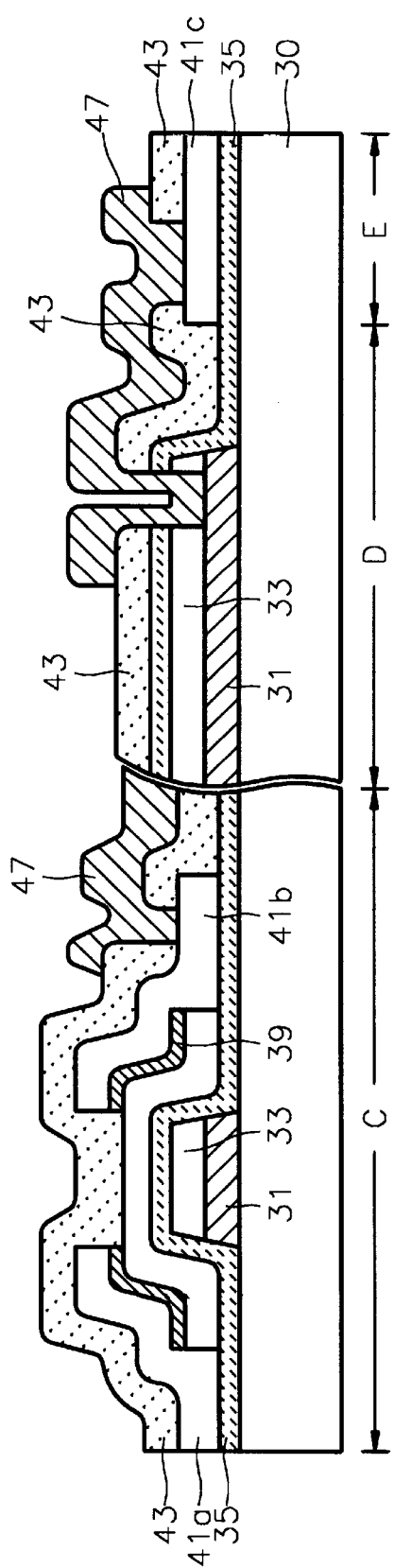

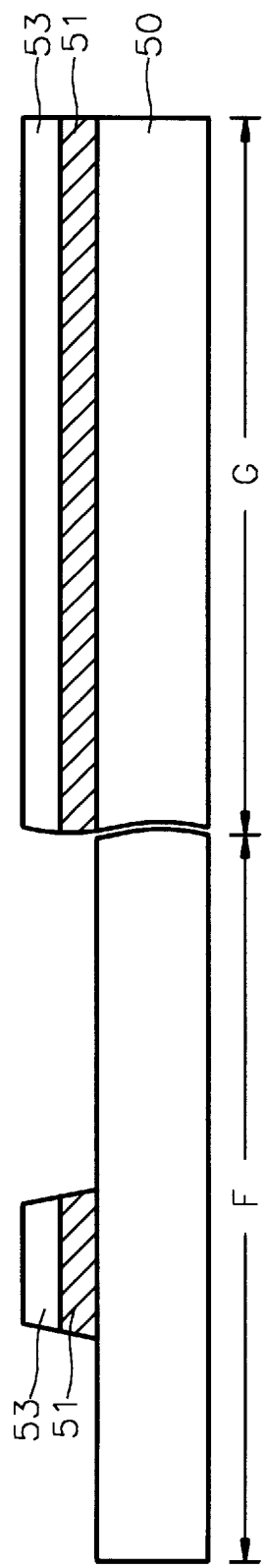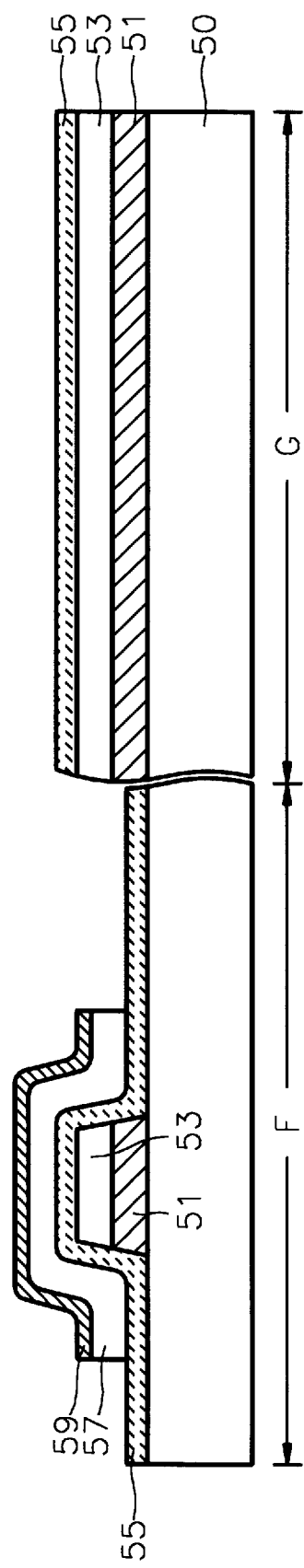

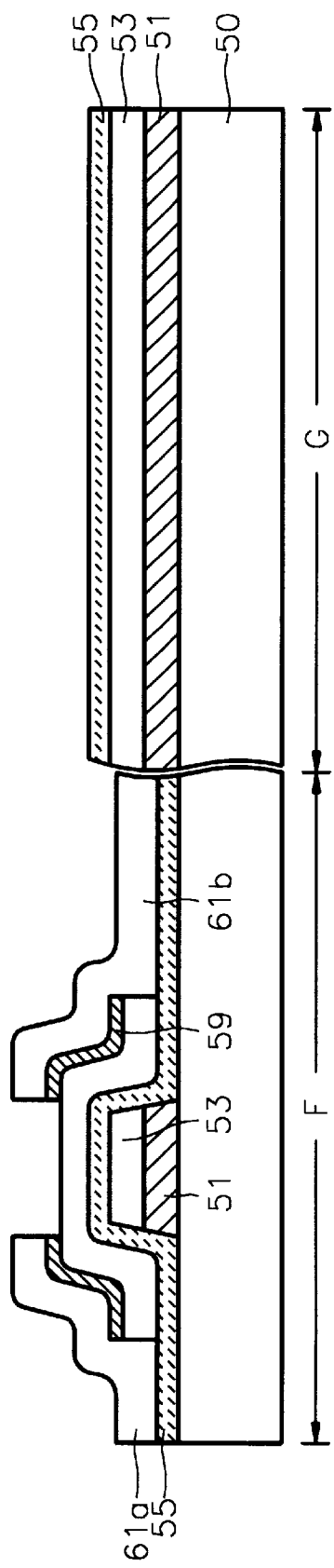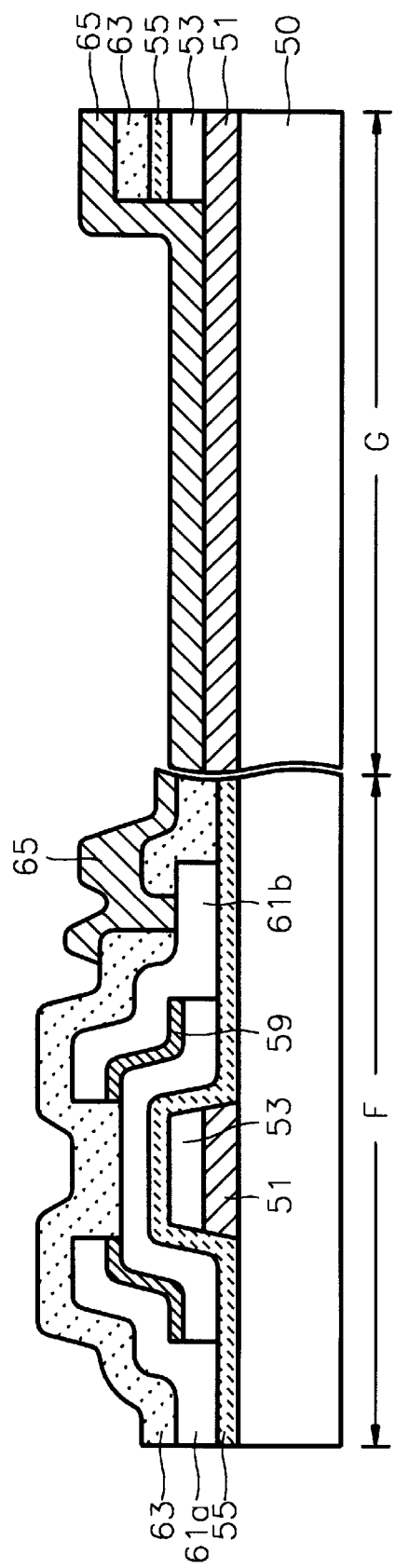

METHOD FOR MANUFACTURING A LIQUID CRYSTAL DISPLAY

BACKGROUND OF THE INVENTION

The present invention relates to a method for manufacturing a liquid crystal display. More particularly, the present invention relates to a method for manufacturing a liquid crystal display having a thin film transistor as an active device, by which it is possible to reduce the number of the photolithography processes.

The liquid crystal display (LCD) is currently the most widely used flat-panel display device. Other devices being developed and rapidly becoming popular include the plasma display panel (PDP), the electro luminescence (EL) device, the field emission display (FED), and the reflex deformable mirror device (DMD), which controls the movement of a mirror.

The LCD uses an optical characteristic of liquid crystal molecules in which the arrangement thereof changes according to an electrical field and a semiconductor technology which forms minute patterns. A thin film transistor LCD ("TFT-LCD"), which uses the thin film transistor as the active device, has various advantages over other LCDs. These advantages include low power consumption, low drive voltage, a thinness, and lightness of weight, among others.

Since the thin film transistor ("TFT") is significantly thinner than a conventional transistor, the process of manufacturing a TFT is complicated, resulting in low productivity and high manufacturing costs. In particular, since a mask is used in every step for manufacturing a TFT, at least seven masks are required. Therefore, various methods for increasing productivity of the TFT and lowering the manufacturing costs have been studied. In particular, a method for reducing the number of the masks used during the manufacturing process has been widely researched.

FIGS. 1 to 5 are sectional views for explaining a conventional method for manufacturing an LCD, as disclosed in U.S. Pat. No. 5,054,887.

In the drawings, reference characters "A" and "B" denote a TFT area and a pad area, respectively. Referring to FIG. 1, after forming a first metal film by depositing pure Al on a transparent substrate 2, gate patterns 4 and 4a are formed out of the first metal film by performing a first photolithography on the first metal film. The gate patterns are then used as a gate electrode 4 in the TFT area and as a gate pad 4a in the pad area.

As shown in FIG. 2, after forming by general photolithography a second photoresist pattern (not shown) that covers a portion of the pad area, an anodized film 6 is formed by oxidizing the first metal film using the photoresist pattern as an anti-oxidation film. The anodized film 6 is then formed on the entire surface of the gate electrode 4 formed in the TFT area, and on a portion of the gate pad 4a in the pad area.

Referring to FIG. 3, an insulating film 8 is formed by depositing a layer such as a nitride film over the anodized film 6. A semiconductor film is then formed by subsequently depositing an amorphous silicon film 10 and an amorphous silicon film 12 doped with impurities on the entire surface of the substrate 2 on which the insulating film 8 is formed. A semiconductor film pattern 10 and 12 to be used as an active portion is then formed in the TFT area by performing a third photolithography on the semiconductor film.

As shown in FIG. 4, a fourth photoresist pattern (not shown) is then formed that exposes a portion of the gate pad 4a formed in the pad area by performing a fourth photolithography on the entire surface of the substrate 2 on which the semiconductor film pattern is formed. Then, a contact hole is then formed in the insulating film 8, which contact hole exposes a portion of the gate pad 4a. The contact hole is formed by etching the insulating film 8 using the fourth photoresist pattern as a mask. A source electrode 14a and a drain electrode 14b are then formed in the TFT area by depositing a chromium ("Cr") film on the entire surface of the substrate having the contact hole and performing a fifth photolithography on the Cr film. In the pad area, a pad electrode 14c connected to the gate pad 4a through the contact hole is formed. At this time, the impurity doped-amorphous silicon film 12 on the upper portion of the gate electrode 4 formed in the TFT area during the photolithography process is partially etched, thus exposing a portion of the amorphous silicon film 10.

Referring to FIG. 5, a protection film 16 is then formed by depositing an oxide film over the entire surface of the substrate 2 on which the source electrode 14a, the drain electrode 14b and the pad electrode 14c are formed. Then, contact holes are formed that expose a portion of the drain electrode 14b of the TFT area and a portion of the pad electrode 14c of the pad area. The contact holes are formed by performing a sixth photolithography on the protection film 16.

Subsequently, pixel electrodes 18 and 18a are formed by depositing indium tin oxide ("ITO"), a transparent conductive material, over the entire surface of the substrate, including the contact hole, and performing a seventh photolithography process on the resultant ITO film. As a result of this seventh lithography, the drain electrode 14b and the pixel electrode 18 are connected in the TFT area, and the pad electrode 14c and the pixel electrode 18a are connected in the pad area.

According to the conventional method for manufacturing the LCD, pure aluminum ("Al") is used as the gate electrode material to lower the resistance of a gate line. An anodizing process is therefore required to prevent a hillock caused by the Al. This additional anodizing step complicates the manufacturing process, reduces productivity, and increases manufacturing costs.

SUMMARY OF THE INVENTION

It is an object of the present invention to provide a more efficient method for manufacturing a liquid crystal display in which manufacturing costs are reduced by reducing the number of photolithography processes.

To achieve the above object, there is provided a method for manufacturing a liquid crystal display according to the present invention, comprising the steps of forming a gate electrode and a gate pad by depositing a first metal film and a second metal film over a substrate in a TFT area and a gate-pad connecting area, respectively, by a first photolithography process; forming an insulating film over the gate electrode and the gate pad; forming a semiconductor film pattern over the insulating film in the TFT area by a second photolithography process; forming a source electrode/drain electrode and pad electrode in the TFT portion and pad portion, respectively, using a third photolithography process, the source electrode/drain electrode and pad electrode all being comprised of a third metal film; forming a passivation film pattern by a fourth photolithography process, the passivation film exposing a portion of the drain electrode, a portion of the gate pad, and a portion of the pad electrode; exposing the first metal film by etching a portion of the second metal film that comprises the gate pad using the passivation film pattern as a mask; and forming a pixel electrode connected to the drain electrode of the TFT area by a fifth photolithography process, the pixel electrode acting to connect the gate pad of the gate-pad connecting area to the pad electrode of the pad area.

The first metal film is preferably formed of a refractory metal, i.e., one selected from the group consisting of Cr, Ta, Mo, and Ti and the second metal film is preferably formed of Al or an Al-alloy.

The third metal film preferably comprises a material selected from the group consisting of Cr, Ta, Mo, and Ti.

Taper-etching is preferably performed on the second metal film in the first photolithography process and then etching the first metal film is performed, thus the first metal film is wider than the second metal film.

To achieve the above object, there is provided another method for manufacturing a liquid crystal display, comprising the steps of forming a gate electrode and a gate pad by depositing a first metal film and a second metal film over a substrate of a TFT area and a pad area, respectively, by a first photolithography process; forming an insulating film over the gate electrode and the gate pad; forming a semiconductor film pattern over the insulating film in the TFT area by a second photolithography process; forming a source electrode and a drain electrode in the TFT area by a third photolithography process, the source electrode and the drain electrode comprising a third metal film; forming a passivation film pattern that exposes a portion of the drain electrode of the TFT area and a portion of the gate pad of the pad area by forming a passivation film over the source electrode and the drain electrode and performing a fourth photolithography process on the passivation film and the insulating film; exposing the first metal film of the pad area by etching the second metal film using the passivation film pattern as a mask; and forming a pixel electrode that is connected to the drain electrode of the TFT area and contacts the first metal film of the pad area by a fifth photolithography process.

The first metal film is preferably formed of a refractory metal, i.e., one selected from the group consisting of Cr, Ta, Mo, and Ti and the second metal film is preferably formed of Al or an Al-alloy.

The third metal film preferably comprises a material selected from the group consisting of Cr, Ta, Mo, and Ti and the insulating film preferably comprises a nitride film $SiN_x$ or a double film of a nitride film $SiN_x$ and an oxide film $SiO_x$.

Taper-etching is preferably performed on the second metal film in the first photolithography process and then etching the first metal film is performed.

According to the present invention, it is possible to reduce the number of photolithography processes by forming the gate electrode in a double structure of a refractory metal film and an Al film formed on the upper portion of the refractory metal film, thus sharply reducing manufacturing costs and improving manufacturing yield. Also, it is possible to suppress growth of a hillock of the Al film due to a stress relaxation of the refractory metal film and to reduce contact resistance between a pixel electrode to be formed in a following process and the Al film by etching the Al film which constitutes the gate electrode prior to forming the pixel electrode.

BRIEF DESCRIPTION OF THE DRAWINGS

The above object and advantages of the present invention will become more apparent by describing in detail a preferred embodiment thereof with reference to the attached drawings in which: FIGS. 1 through 5 are sectional views illustrating a conventional method for manufacturing a liquid crystal display;

FIGS. 7 through 12 are sectional views illustrating a method for manufacturing a liquid crystal display according to a first preferred embodiment of the present invention; and FIGS. 13 through 16 are sectional views illustrating a method for manufacturing a liquid crystal display according to a second preferred embodiment of the present invention.

DETAILED DESCRIPTION OF THE INVENTION

Figure 4:
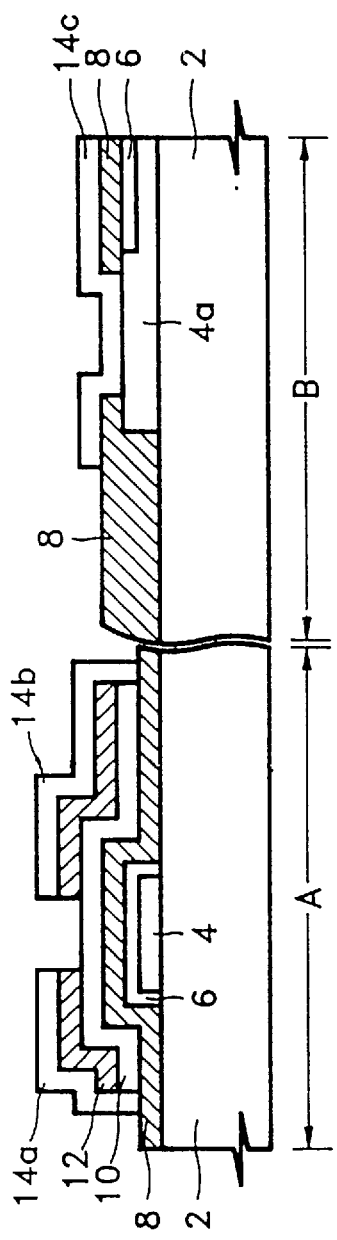
Figure 5:
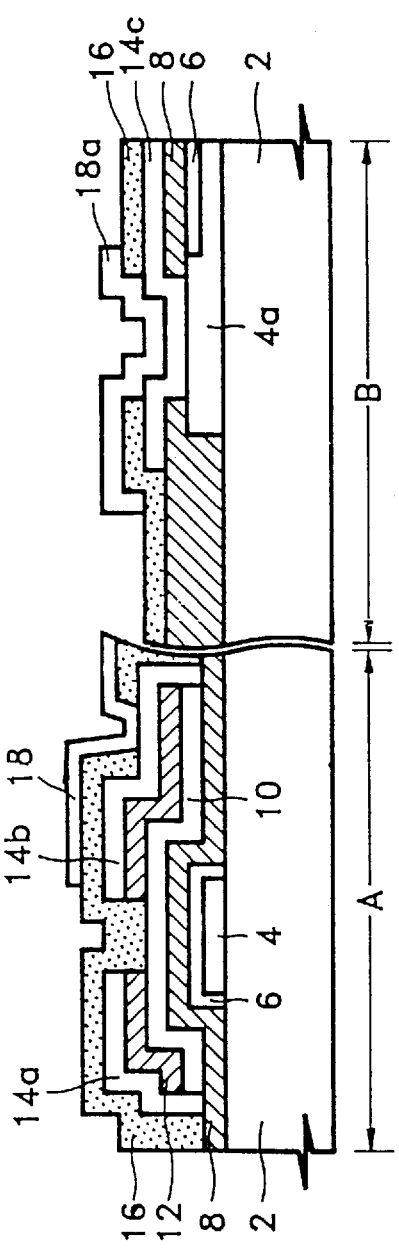
Figure 6:
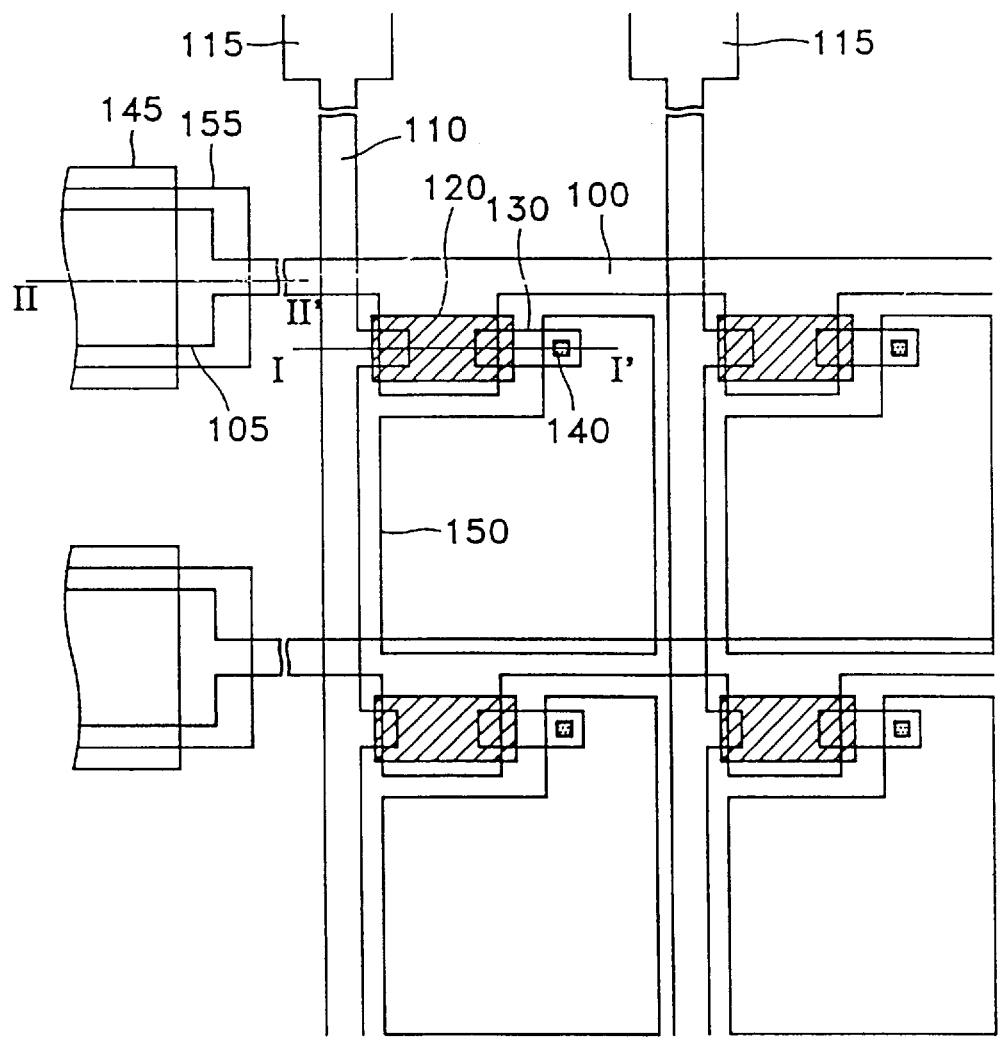
FIG. 6 is a schematic plan view illustrating the mask patterns used in manufacturing a liquid crystal display according to first and second preferred embodiments of the present invention.

FIG. 6 is a schematic plan view of the mask patterns used for manufacturing a liquid crystal display according to the present invention, in which reference numeral 100 denotes a mask pattern for forming a gateline; reference numeral 105 denotes a mask pattern for forming a gate pad; reference numeral 110 denotes a mask pattern for forming a data line, reference numeral 115 denotes a mask pattern for forming a data pad; reference numeral 120 denotes a mask pattern for forming a semiconductor film; reference numeral 130 denotes a mask pattern for forming a source electrode/drain electrode; reference numeral 140 denotes a mask pattern for forming a contact hole for connecting a pixel electrode to the drain electrode in the TFT area; reference numeral 145 denotes a mask pattern for forming a contact hole for connecting a gate pad in the pad area to the pixel electrode; reference numeral 150 denotes a mask pattern for forming a pixel electrode in the TFT area; and reference numeral 155 denotes a mask pattern for forming a pixel electrode in the pad portion.

Referring to FIG. 6, the gate line 100 is arranged horizontally, and the data line 110 is arranged perpendicular to the gate line. The plurality of gate lines 100 and data lines 110 in the device are arranged together in a matrix pattern. The gate pad 105 is provided at the end portion of the gate line 100, and the data pad 115 is provided at the end portion of the data line 110. Pixel portions are respectively arranged in the matrix pattern in the portion bounded by the two adjacent gate lines and the data line. The gate electrodes of the respective TFTs are formed so as to protrude into the pixel portions from the respective gate lines. The semiconductor film 120 is formed between the drain electrodes and the gate electrodes of the respective TFTs. The source electrodes of the TFTs are formed in protruding portions from the data line 110. The pixel electrodes 150 comprise transparent ITO and are formed in the respective pixel portions.

FIGS. 7 to 12 are sectional views illustrating a method for manufacturing a liquid crystal display according to a first embodiment of the present invention. The reference character "C" denotes the TFT area, which is a sectional view taken along I–I' of FIG. 6. The reference characters "D" and "E" denote the gate-pad connecting area and the pad area, respectively, which are sectional views taken along II–II' of FIG. 6.

FIG. 7 shows the steps for forming a gate electrode. Initially, a first metal film 31 is formed by depositing a thick film of refractory metal on a transparent substrate 30. A second metal film 33 is then formed by depositing a thick film of Al or an Al-alloy over the first metal film 31. The first metal film 31 is preferably a 300 Å–4,000 Å thick, and preferably comprises one of Cr, Ta, Mo, and Ti, most preferably Cr. The second metal film 33 is preferably 1,000 Å–4,000 Å thick and comprises Al or an Al-alloy such as Al—Nd or Al—Ta.

Gate electrodes are then formed in the TFT area and the gate-pad connecting area by performing a first photolithography on the first and the second metal films 31 and 33. At this time, the first photolithography process is performed by taper-etching the second metal film 33 and then the first metal film 31. In this way, the width of the first metal film 31 is made larger than that of the second metal film 33.

It is possible to prevent generation of an Al hillock caused by the differences in thermal expansion between the Al film or the Al-alloy film and the substrate by forming a refractory metal film in the lower portion of the Al film or the Al-alloy film. Also, it is possible to perform the taper-etching using the difference in etching ratio between the Al film or the Al-alloy film and the substrate even though a conventional etching processing is applied. Therefore, a step coverage is preferably performed when depositing a following material after forming the gate electrode.

FIG. 8 shows the steps for forming a semiconductor film pattern. An insulating film 35 is formed by depositing a nitride film or an oxide film, for example, over the entire surface of the substrate 30 on which the gate electrode is formed. A semiconductor film is then formed by depositing an amorphous silicon film 37 and a doped amorphous silicon film 39 over the entire surface of the substrate 30 on which the insulating layer is formed. The semiconductor film pattern, which is itself comprised of the amorphous silicon film 37 and the doped amorphous silicon film 39, is formed in the TFT area by performing a second photolithography on the doped and undoped semiconductor films 39 and 37. The insulating film 35, the amorphous silicon film 37, and the doped amorphous silicon film 39 are preferably formed to thicknesses of 2,000~9,000 Å, 1,000~4,000 Å, and 300~1,000 Å, respectively.

FIG. 9 shows the steps for forming a source electrode 41a and a drain electrode 41b. A third metal film is initially deposited over the entire surface of the substrate on which the semiconductor film pattern is formed. A source electrode 41a and a drain electrode 41b are then formed in the TFT area and a pad electrode 41c is formed in the pad area by performing a third photolithography on the third metal film. The third metal film is preferably about 300~4,000 Å thick, and comprises a refractory metal such as the Cr. During this step, a portion of the doped amorphous silicon film 39 is also etched, thus exposing a portion of the amorphous silicon film 37.

FIG. 10 shows the steps for forming a passivation film pattern 43. Initially, a passivation film is formed over the entire surface of the substrate 30. The passivation film is preferably a nitride film. The passivation film pattern 43 is then subjected to a fourth photolithography to create the passivation film pattern 43. At this time, a portion of the drain electrode 41b of the TFT area and a portion of the pad electrode 41c of the pad area are exposed. Also, the gate electrode formed in the gate pad connecting portion is simultaneously etched, thus exposing the second metal film 33. The gate pad connecting portion includes the passivation film pattern 43 and the insulating film 35 formed on the second metal film 33.

FIG. 11 shows steps of etching the exposed second metal film 33 of the gate-pad connecting area. The first metal film 31 is initially exposed by etching the second metal film 33 in the gate pad connecting portion 45 and the passivation film pattern 43. This process reduces the contact resistance between the pixel electrode 47 to be formed in a subsequent process and the second metal film 33.

FIG. 12 shows the steps for forming a pixel electrode 47. Initially, an ITO film is deposited over the entire surface of the substrate 30 on which the passivation film pattern is formed. The ITO film is then subjected to a fifth photolithography to create the pixel electrode 47. As a result of this process, the pixel electrode 47 and the drain electrode 41b are connected in the TFT area. Also, the gate electrode of the gate-pad connecting area and the pad electrode 41c of the pad area are connected through the pixel electrode 47.

FIGS. 13 through 16 are sectional views for explaining a method for manufacturing a liquid crystal display according to a second preferred embodiment of the present invention. Reference character "F" denotes a TFT area, which is a sectional view taken along the line I–I' of FIG. 6 and reference character "G" represents a pad area, which is a sectional view taken along the line II–II' of FIG. 6.

FIG. 13 shows the step for forming the gate electrode. Initially, a first metal film 51 is formed by depositing a film of a refractory metal over the entire surface of the transparent substrate 50. A second metal film 53 is then formed by depositing a film of Al or Al-alloy over the first metal film. The refractory metal is preferably 300~4,000 Å thick, and preferably comprises Cr, Ta, or Ti. The second metal film in preferably 1,000~4,000 Å thick. The gate electrode and the gate pad are then formed in the TFT area and the pad area by performing a first photolithography on the first and second metal films 51 and 53.

The gate electrode and the gate pad are simultaneously formed using a single mask. In the first photolithography process, taper-etching is performed on the second metal film 53 and then on the first metal film 51. As a result of this taper-etching, the first metal film 51 is made wider than the second metal film 53.

FIG. 14 shows the step of forming a semiconductor film pattern. A semiconductor film pattern to be used as an active area is formed in the TFT area. The semiconductor film pattern is formed by depositing an insulating film 55 and a semiconductor film over the entire surface of the substrate 50 in which the gate electrode and the gate pad are formed, and then performing a second photolithography on the semiconductor film. The insulating film 55 is preferably formed to a thickness of 2,000~9,000 Å using a single-film nitride film $SiN_x$ or a double-film comprising a nitride film $SiN_x$ and an oxide film $SiO_x$. The semiconductor film pattern preferably comprises an amorphous silicon layer 57 and a doped amorphous silicon layer 59.

FIG. 15 shows the steps for forming a source electrode 61a and a drain electrode 61b. The source electrode 61a and the drain electrode 61b are formed in the TFT area from a third metal film of a refractory metal. The third metal film is initially deposited over the entire surface of the substrate 50 on which the semiconductor film pattern 57, and is then subjected to a third photolithography to form the source electrode 61a and the drain electrode 61b. The third metal film is preferably 300~4,000 Å thick and preferably comprises Cr, Ti, or Mo.

FIG. 16 shows the steps of forming a passivation film pattern 63 and a pixel electrode 65. A passivation film is initially formed by depositing a film such as a nitride film over the entire surface of the substrate in which the source electrode 61a and the drain electrode 61b are formed. A fourth photolithography is then performed on the passivation film to form the passivation film patters 63. In the fourth photolithography, a portion of the drain electrode 61b of the TFT area is exposed and the insulating film and the passivation film in the upper portion of the gate pad are simultaneously etched in the pad area, thus exposing a portion of the gate pad.

The first metal film 51 is then exposed by etching the portion of the second metal film 53 that is exposed by the passivation film pattern. It is possible to reduce the contact resistance between a pixel electrode 65 to be formed in a subsequent process and the second metal film 53 by etching the second metal film 53.

The pixel electrode 65, which is connected to the drain electrode 61b of the TFT area and to the first metal film of the pad area, is then formed by depositing the ITO film over the existing structure.

As mentioned above, the method for manufacturing the liquid crystal display according to the present invention makes it possible to reduce manufacturing costs and to improve the manufacturing yield by using double gate electrodes. Using these methods, only five photolithography processings are required compared to the seven or more photolithography processings required by conventional methods.

In addition, it is possible to suppress the growth of the hillock of the Al film due to the stress relaxation of the refractory metal film by forming the gate electrode of the double films of the refractory metal film and the Al film or Al-alloy film formed on the refractory metal film.

Also, as shown in FIG. 16, it is possible to reduce the contact resistance between the pixel electrode formed in a subsequent process and the Al film by etching the Al film or the Al-alloy film prior to forming the pixel electrode in the pad area.

The present invention is not limited to the above-described embodiments. Various changes and modifications may be effected by one having an ordinary skill in the art and remain within the scope of the invention, as defined by the appended claims.

What is claimed is:

1. A method for manufacturing a liquid crystal display, comprising the steps of:
    forming a gate electrode and a gate pad by depositing a first metal film and a second metal film over a substrate in a TFT area and a gate-pad connecting area, respectively, by a first photolithography process;
    forming an insulating film over the gate electrode and the gate pad;
    forming a semiconductor film pattern over the insulating film in the TFT area by a second photolithography process;
    forming a source electrode/drain electrode and pad electrode in the TFT portion and pad portion, respectively, using a third photolithography process, the source electrode/drain electrode and pad electrode all being comprised of a third metal film;
    forming a passivation film pattern by a fourth photolithography process, the passivation film exposing a portion of the drain electrode, a portion of the gate pad, and a portion of the pad electrode;
    exposing the first metal film by etching a portion of the second metal film that comprises the gate pad using the passivation film pattern as a mask; and
    forming a pixel electrode connected to the drain electrode of the TFT area by a fifth photolithography process, the pixel electrode acting to connect the gate pad of the gate-pad connecting area to the pad electrode of the pad area.

2. A method for manufacturing a liquid crystal display as recited in claim 1, wherein the first metal film comprises a refractory metal.

3. A method for manufacturing a liquid crystal display as recited in claim 1, wherein the second metal film comprises Al or an Al-alloy.

4. A method for manufacturing a liquid crystal display as recited in claim 2, wherein the first metal film comprises a material selected from the group consisting of Cr, Ta, Mo, and Ti.

5. A method for manufacturing a liquid crystal display as recited in claim 1, wherein the third metal film comprises a material selected from the group consisting of Cr, Ta, Mo, and Ti.

6. A method for manufacturing a liquid crystal display as recited in claim 1, wherein taper-etching is performed on the second metal film in the first photolithography process and then etching of the first metal film is performed.

7. A method for manufacturing a liquid crystal display as recited in claim 1, wherein the first metal film is wider than the second metal film.

8. A method for manufacturing a liquid crystal display, comprising the steps of:
    forming a gate electrode and a gate pad by depositing a first metal film and a second metal film over a substrate of a TFT area and a pad area, respectively, by a first photolithography process;
    forming an insulating film over the gate electrode and the gate pad;
    forming a semiconductor film pattern over the insulating film in the TFT area by a second photolithography process;
    forming a source electrode and a drain electrode in the TFT area by a third photolithography process, the source electrode and the drain electrode comprising a third metal film;
    forming a passivation film pattern that exposes a portion of the drain electrode of the TFT area and a portion of the gate pad of the pad area by forming a passivation film over the source electrode and the drain electrode and performing a fourth photolithography process on the passivation film and the insulating film;
    exposing the first metal film of the pad area by etching the second metal film using the passivation film pattern as a mask; and
    forming a pixel electrode that is connected to the drain electrode of the TFT area and contacts the first metal film of the pad area by a fifth photolithography process.

9. A method for manufacturing a liquid crystal display as recited in claim 8, wherein the first metal film comprises a refractory metal.

10. A method for manufacturing a liquid crystal display as recited in claim 8, wherein the second metal film comprises Al or an Al-alloy.

11. A method for manufacturing a liquid crystal display as recited in claim 9, wherein the first metal film comprises a material selected from the group consisting of Cr, Ta, Mo, and Ti.

12. A method for manufacturing a liquid crystal display as recited in claim 8, wherein the third metal film comprises a material selected from the group consisting of Cr, Ta, Mo, and Ti.

13. A method for manufacturing a liquid crystal display as recited in claim 8, wherein taper-etching is performed on the second metal film in the first photolithography process and then etching the first metal film is performed.

14. A method for manufacturing a liquid crystal display as recited in claim 8, wherein the insulating film comprises a nitride film $SiN_x$.

15. A method for manufacturing a liquid crystal display as recited in claim 8, wherein the insulating film comprises a double film including a nitride film $SiN_x$ and an oxide film $SiO_x$.

* * * * *